(12) United States Patent
Egawa (10) Patent No.: US 6,195,284 B1
(45) Date of Patent: Feb. 27, 2001

(54) SEMICONDUCTOR MEMORY DEVICE

(75) Inventor: Tonomi Egawa, Kanagawa (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/579,320

(22) Filed: May 25, 2000

(30) Foreign Application Priority Data

May 28, 1999 (JP) .................................................. 11-150294

(51) Int. Cl.[7] .................................................. G11C 16/04

(52) U.S. Cl. ............................... 365/185.03; 365/185.11; 365/230.03; 365/230.04

(58) Field of Search ............................ 365/185.03, 104, 365/185.11, 230.03, 230.04

(56) References Cited

U.S. PATENT DOCUMENTS 5,574,879 * 11/1996 Wells et al. .................. 365/185.03 X

* cited by examiner

*Primary Examiner*—Huan Hoang (57) ABSTRACT

A semiconductor memory device in accordance with this invention having multi-valued memory cell that stores a plurality of bits has a recognition apparatus judging whether an input address signal designates upper data or designates lower data among a plurality of bits, a row selecting apparatus selecting word lines corresponding with the input address signal and applying to selected word lines only word line voltages necessary for reading out upper data or lower data among a plurality levels of word line voltages corresponding with results of the recognition apparatus, a column selecting apparatus selecting bit lines in accordance with the input address signal, and an output apparatus generating output data in accordance with levels of the selected bit lines.

5 Claims, 6 Drawing Sheets

SEMICONDUCTOR MEMORY DEVICE

BACKGROUND OF THE INVENTION

1. Field of the Invention

The present invention relates to a non-volatile semiconductor memory device and in particular to a semiconductor memory device having a multi-valued memory cell that stores a plurality of bits.

2. Description of the Prior Art

As means to realize a non-volatile semiconductor memory device, a technology using a multi-valued memory cell memorizing information with bits is known. In such a semiconductor memory device, threshold values for the multi-valued memory cell are set into multi-steps, and for example, when threshold values are set into four steps, four kinds of information, that is, 2-bit information will be stored in a single multi-valued memory cell.

Accordingly, a memory capacity of the same quantity as a normal semiconductor memory device, which can only store one-bit information, will become obtainable with a half cells of the above-described semiconductor memory device. Configuration and read-out of such a conventional semiconductor memory device will be described as follows with reference to drawings.

Figure 6:
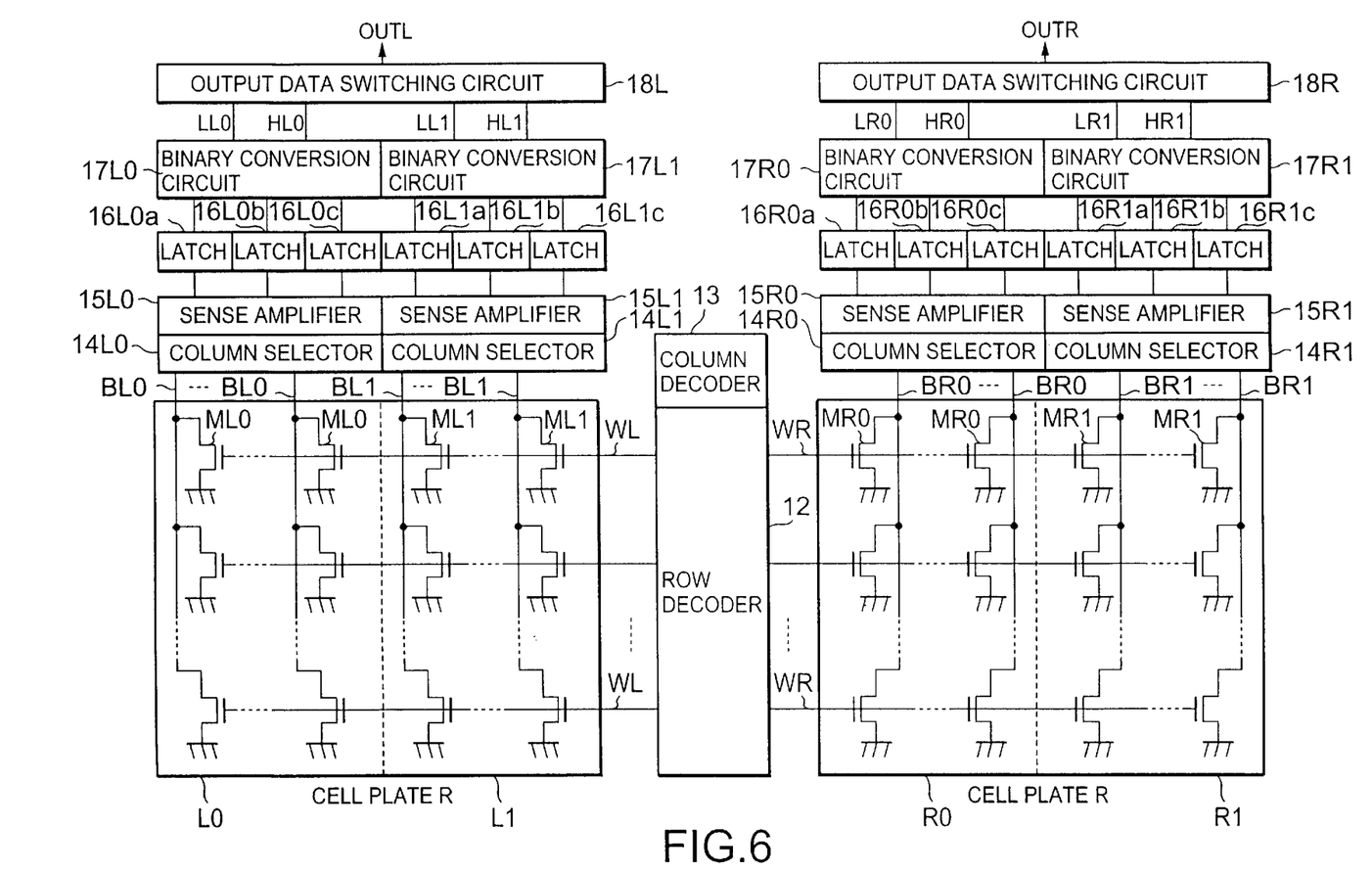
FIG. 6 is a block diagram showing a configuration of a conventional non-volatile semiconductor memory device.

FIG. 6 is a block diagram showing a configuration of a conventional non-volatile semiconductor memory device. The semiconductor memory device in FIG. 6 comprises a memory cell array in which multi-valued memory transistors are disposed configuring a matrix. This memory array is classified into a cell plate L and a cell plate R, and further the cell plate L is classified into a cell plate L0 corresponding with an even address and a cell plate L1 corresponding with an odd address while the cell plate R is classified into a cell plate R0 corresponding to an even address and a cell plate R1 corresponding with an odd address.

Memory cell transistors ML0, ML1, MR0, and MR1 are respectively set at any one of threshold values among four kinds of threshold values VT0, VT1, VT2, and VT3 (but, VT0<VT1<VT2<VT3). Accordingly, two-bit information will be stored at the memory cell transistors ML0, ML1, MR0, and MR1 respectively.

A row decoder 12 selects respectively one among a plurality of word lines WL and among word lines WR in accordance with an address signal inputted from outside.

A column decoder 13 controls column selectors 14L0, 14L1, 14R0, and 14R1 based on input address signals. A column selector 14L0 selects one among a plurality of bit line BL0, a column selector 14L1 selects one among a plurality of bit line BL1, a column selector 14R0 selects one among a plurality of bit line BR0, and a column selector 14R1 selects one among a plurality of bit line BR1.

Sense amplifiers 15L0, 15L1, 15R0, and 15R1 amplify outputs from column selectors 14L0, 14L1, 14R0, and 14R1.

Figure 7:
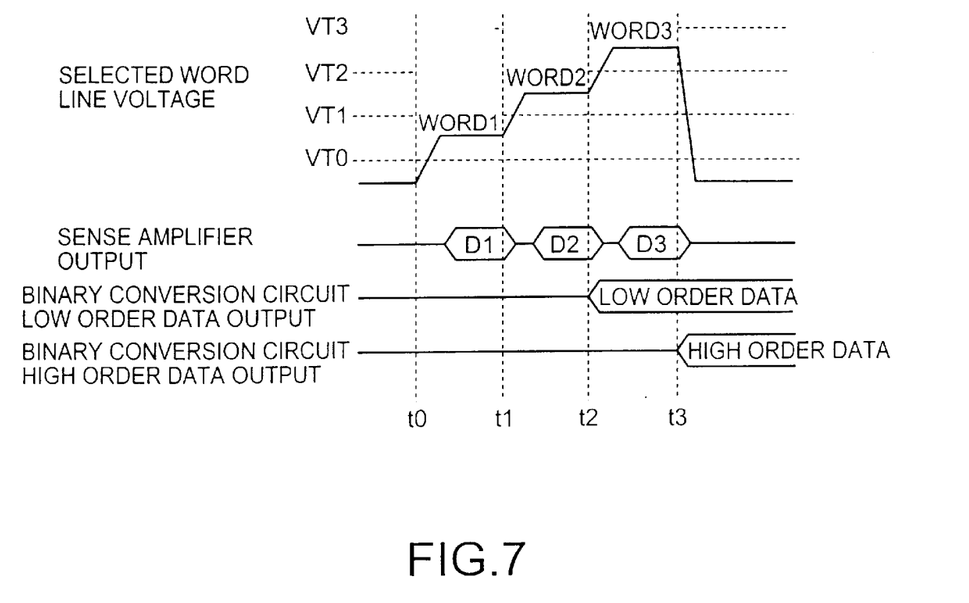
FIG. 7 is a timing chart showing how word-line voltages are applied to selected word-lines in the non-volatile semiconductor memory device in FIG. 6.

Here, the row decoder 12 applies three-stage word-line voltage as shown in FIG. 7 to selected word-lines WL and WR in order to read out information of memory cell transistors ML0, ML1, MR0, and MR1. In FIG. 7, a mid-potential between the threshold values VT0 and VT1 is determined as a word 1, a mid-potential between the threshold values VT1 and VT2 is determined as a word 2, and a mid-potential between the threshold values VT2 and VT3 is determined as a word 3.

This will serve to sequentially cause data D1 corresponding with the potential of the word 1, D2 corresponding with the potential of the word 2, and D3 corresponding with the potential of the word 3 to appear at outputs of the sense amplifiers 15L0, 15L1, 15R0, and 15R1.

Latch circuits 16L0a, 16L1a, 16R0a, and 16R1a are circuits to maintain the data D1, latch circuits 16L0b, 16L1b, 16R0b, and 16R1b are circuits to maintain the data D2, latch circuits 16L0c, 16L1c, 16R0c, and 16R1c are circuits to maintain the data D3.

A binary conversion circuit 17L0 implements exclusive OR operation on the output data D3 of output data D1 of the latch circuit 16L0a and output data D3 of the latch circuit 16L0c, outputs its result as high order data HL0, and outputs output data D2 of the latch circuit 16L0b as low order data LL0.

A binary conversion circuit 17L1 implements exclusive OR operation on the output data D3 of output data D1 of the latch circuit 16L1a and output data D3 of the latch circuit 16L1c, outputs its result as high order data HL1 and outputs output data D2 of the latch circuit 16L1b as low order data LL1.

The binary conversion circuit 17R0 implements exclusive OR operation on the output data D1 of the latch circuit 16R0a and output data D3 of the latch circuit 16R0c, outputs its result as high order data HR0 and outputs output data D2 of the latch circuit 16R0b as low order data LR0.

In addition, the binary conversion circuit 17R1 implements exclusive OR operation on the output data D1 of the latch circuit 16R1a and output data D3 of the latch circuit 16R1c, outputs its result as high order data HR1 and outputs output data D2 of the latch circuit 16R1b as low order data LR1.

The output data conversion circuits 18L and 18R select either one of input data in accordance with an input address signal so as to output it as output data OUTL and OUTR.

A conventional semiconductor memory device having a multi-valued memory cell applies word-line voltage as in FIG. 7 to a memory cell transistor selected with the row decoder 12, the column decoder 13 and the column selectors 14L0, 14L1, 14R0, and 14R1 so as to read out data D1 to D3 sequentially and output high order data or low order data out of obtained two bits. That is, regardless whether the high order data or the low order data are read out, the order of variation of word-line voltage always remains same. Therefore, when high order data are appointed to be read out, unnecessary data D2 will be read out while unnecessary data D1 and D3 will be read out when low order data are appointed to be read out.

As described above, the conventional semiconductor memory device having a multi-valued memory cell, which varies the word-line voltage into multiple stages, has a problem that it requires longer read-out time than semiconductor memory device which is not a multi-valued one.

BRIEF SUMMARY OF THE INVENTION

Object of the Invention

Object of the present invention is to shorten read-out time in a semiconductor memory device having a multi-valued memory cell memorizing a plurality of bit.

Summary of the Invention

A semiconductor memory device of the present invention comprises a memory array in which multi-valued memory cells (ML0, ML1, MR0, and MR1) which store a plurality of bits are disposed in a matrix, a plurality of word lines (WL and WR) provided in memory cells on each row, a plurality of bit lines (BL0, BL1, BR0, and BR1) provided in memory cells on each column, recognition means (1) to judge whether an input address signal designates upper data or designates lower data among a plurality of bits, row selection means (2) to select word lines in accordance with input address signals and apply only a smallest word line voltage necessary for reading out upper data or lower data among word line voltage with a plurality of levels to selected word lines, column selection means (3, 4L0, 4L1, 4R0, and 4R1) to select bit lines in accordance with input address signals, and output means (6L0a to 6L0C, 6L1a to 6L1c, 6R0a to 6R0c, 6L1a to 6L1c, 7L0, 7L1, 7R0, 7R1, 8L, and 8R) generating output data in accordance with selected bit line levels.

Thus, in accordance with results of the address recognition means the row selecting means apply only the smallest word line voltage necessary for reading out upper data or lower data to the selected word lines so that unnecessary word line voltage will no longer be applied as in conventional cases.

In addition, a semiconductor memory device of the present invention comprises a memory cell array in which multi-valued memory cells (ML0, ML1, MR0, and MR1) are disposed in a matrix, a plurality of a first word line (W0) provided in memory cells on each row corresponding with even addresses, a plurality of second word line (W1) provided in memory cells on each row corresponding with odd addresses, a plurality of bit lines (BL0, BL1, BR0, and BR1) provided in memory cells on each column, recognition means (1a) to judge whether a present input address signal designates even address or designates odd address and to judge whether an input address signal designates upper data or designates lower data among a plurality of bits, row selection means (2a) to select word lines from any one of the first word line or the second word line in accordance with present input address signals and apply only a smallest word line voltage necessary for reading out upper data or lower data among the word line voltage with a plurality of levels to selected word lines in accordance with results of recognition means, column selection means (3a, 4L0, 4L1, 4R0, and 4R1)to select bit lines in accordance with present input address signals, and output means (6L0a to 6L0c, 6L1a to 6L1c, 6R0a to 6R0c, 6L1a to 6L1c, 7L0, 7L1, 7R0, 7R1, 8L, and 8R) generating output data in accordance with selected bit line levels.

In addition, as an example of configuration of the above-described semiconductor memory device, the recognition means (1a) judge whether an input address signal in one step forward from present input address signal designates upper data or designates lower data when serial continuous access is implemented, the row selection means (2a) select word lines in accordance with present input address signals when serial continuous access is implemented and select word lines in accordance with input address signals in one step forward so that for selected word lines based on present input address signals, only a word line voltage necessary is applied for reading out upper data or lower data for selected word lines based on present input address signals in accordance with results of recognition means based on present input address signals, and at the same time only a word line voltage necessary is applied for reading out upper data or lower data for selected word lines based on input address signals in one step forward in accordance with results of recognition means based on input address signals in one step forward, and the column selection means (3a, 4L0, 4L1, 4R0, and 4R1) select bit lines in accordance with present input address signals and at the same time select bit lines in accordance with input address signals in one step forward.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

An electric beam exposing method related to an embodiment of the present invention will be described in detail with reference to drawings.

Figure 1:
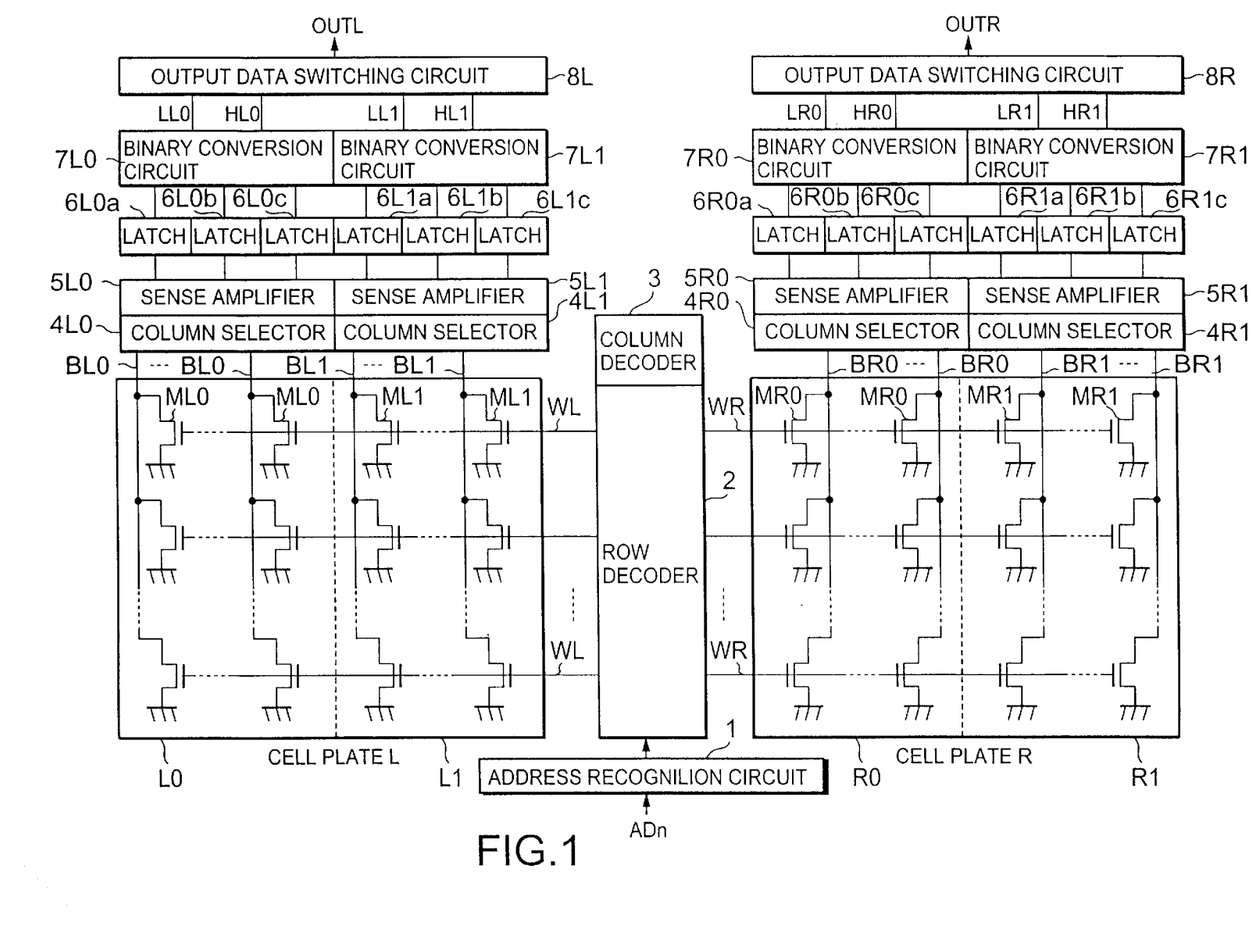
FIG. 1 is a block diagram showing a configuration of non-volatile semiconductor memory device to become a first embodiment of the present invention.

Next, an embodiment of the present invention will be described in detail with reference to drawings. FIG. 1 is a block diagram showing a configuration of a non-volatile semiconductor memory device to become a first embodiment of the present invention.

A semiconductor memory device of the present embodiment comprises a memory cell array in which multi-valued memory cell transistors memorizing information with a plurality of bit are disposed configuring a matrix.

This memory cell array is classified into a cell plate L and a cell plate R as shown in FIG. 1.

Moreover, the cell plate L is classified into the cell plate L0 corresponding to an even address and a cell plate L1 corresponding to an odd address.

Likewise, the cell plate R is classified into the cell plate R0 corresponding to an even address and a cell plate R1 corresponding to an odd address.

Inside the cell plate L0, multi-valued memory cell transistors ML0 corresponding with even addresses are disposed configuring a matrix while inside the cell plate L1, multi-valued memory cell transistors ML1 corresponding with odd addresses are disposed configuring a matrix. The sources respectively for memory cell transistors ML0 and ML1 are grounded.

A plurality of word lines WL, which are provided respectively for memory cell transistors ML0 and ML1 for each row inside the cell plate L, are brought into common connection with the gates of memory cell transistors ML0 and ML1 of corresponding rows.

A plurality of bit lines BL0, which are provided respectively for memory cell transistors ML0 for each column inside the cell plate L0, are brought into common connection with the drains of memory cell transistors ML0 of corresponding columns. In addition, bit lines BL1, which are provided respectively for memory cell transistors ML1 for each column inside the cell plate L1, are brought into common connection with the drains of memory cell transistors ML1 of corresponding columns.

Likewise inside the cell plate R0, multi-valued memory cell transistors MR0 corresponding with even addresses are disposed configuring a matrix while inside the cell plate R1, multi-valued memory cell transistors MR1 corresponding with odd addresses are disposed configuring a matrix. The sources respectively for memory cell transistors MR0 and MR1 are earthed.

A plurality of word lines WR, which are provided respectively for memory cell transistors MR0 and MR1 for each row inside the cell plate R, are brought into common connection with the gates of memory cell transistors MR0 and MR1 of corresponding rows.

A plurality of bit lines BR0, which are provided respectively for memory cell transistors MR0 for each column inside the cell plate R0, are brought into common connection with the drains of memory cell transistors MR0 of corresponding columns. In addition, bit lines BR1, which are provided respectively for memory cell transistors MR1 for each column inside the cell plate R1, are brought into common connection with the drains of memory cell transistors MR1 of corresponding columns.

Incidentally, there exists one memory cell transistor having the same address each for memory cell transistors ML0 inside a cell plate L0 and each for memory cell transistors MR0 inside a cell plate R0.

Likewise there exists one memory cell transistor having the same address each for memory cell transistors ML1 inside a cell plate L1 and each for memory cell transistors MR1 inside a cell plate R1.

An address recognition circuit 1 judges whether an address signal inputted from outside designates upper data or lower data among bits stored in the memory cell transistors ML0, ML1, MR0, and MR1. In particular, for example, in accordance with the lowest bit of the address signal being either of 0 or 1, the bits are judged to be upper data or lower data. That is, judgment is feasible with a predetermined bit ADn of an address signal being 0 or 1. Accordingly, as a configuration of the address recognition circuit, a configuration to output data under a predetermined bit of an address signal will do.

The row decoder 2 selects one each from word lines WL and from word lines WR respectively in accordance with the input address signal, and applies only a smallest word line voltage necessary for reading out upper data or lower data in accordance with results of the address recognition circuit 1.

The column decoder 3 decodes input address signals to control column selectors 4L0, 4L1, 4R0, and 4R1.

The column selectors 4L0, 4L1, 4R0, and 4R1 respectively correspond to cell plates L0, L1, R0, and R1.

The column selector 4L0 selects one of bit lines BL0 in accordance with control of the column decoder 3 while the column selector 4L1 selects one of bit lines BL1.

Likewise the column selector 4R0 selects one of bit lines BR0 in accordance with control of the column decoder 3 while the column selector 4R1 selects one of bit lines BR1.

Sense amplifiers 5L0, 5L1, 5R0, and 5R1 correspond respectively with cell plates L0, L1, R0, and R1.

The sense amplifier 5L0 detects/amplifies information of the bit line BL0 selected by the column selector 4L0 while the sense amplifier 5L1 detects/amplifies information of the bit line BL1 selected by the column selector 4L1.

The sense amplifier 5R0 detects/amplifies information of the bit line BR0 selected by the column selector 4R0 while the sense amplifier 5R1 detects/amplifies information of the bit line BR1 selected by the column selector 4R1.

Likewise, the latch circuits 6L0a, 6L0b, and 6L0c correspond with the cell plate L0, the latch circuits 6L1a, 6L1b, and 6L1c correspond with the cell plate L1, the latch circuits 6R0a, 6R0b, and 6R0c correspond with the cell plate R0, and the latch circuits 6R1a, 6R1b, and 6R1c correspond with the cell plate R1.

The latch circuits 6L0a, 6L1a, 6R0a, and 6R1a are circuits to hold data outputted from the sense amplifiers 5L0, 5L1, 5R0, and 5R1 in accordance with the word 1 voltage among a plurality of level of word line voltage regulated in advance.

Likewise, the latch circuits 6L0b, 6L1b, 6R0b, and 6R1a are circuits to hold data outputted in accordance with the output of the word 2, and the latch circuits 6L0c, 6L1c, 6R0c, and 6R1c are circuits to hold data outputted in accordance with the output of the word 3.

Binary conversion circuits 7L0, 7L1, 7R0, and 7R1 correspond respectively with the cell plates L0, L1, R0, and R1.

The binary conversion circuit 7L0 converts the held data by the latch circuits 6L0a, 6L0b, and 6L0c into 2-bit data while the binary conversion circuit 7L1 converts the held data by the latch circuits 6L1a, 6L1b, and 6L1c into 2-bit data.

Likewise, the binary conversion circuit 7R0 converts the data held by the latch circuits 6R0a, 6R0b, and 6R0c into 2-bit data while the binary conversion circuit 7R1 converts the data held by the latch circuits 6R1a, 6R1b, and 6R1c into 2-bit data.

Output data switching circuit 8L and 8R correspond respectively with the cell plates L and R. The output data switching circuits 8L and 8R select any one of input data in accordance with an address signal inputted from outside and output this as output data OUTL and OUTR.

Next, operation of such a semiconductor memory device as above will be described. The semiconductor memory device of the present embodiment is to select one memory cell transistor each inside the cell plates L and R at one access to obtain 2-bit output data OUTL and OUTR.

Each memory cell transistor ML0, ML1, MR0, and MR1 is set at any one of threshold values among four kinds of threshold values VT0, VT1, VT2, and VT3 (but, VT0<VT1<VT2<VT3) at the time of manufacturing. Accordingly, 2-bit information will be stored at each of memory cell transistors ML0, ML1, MR0, and MR1.

When the address signal inputted from outside designates high order data in the 2-bit information, the address recognition circuit 1 outputs a signal controlling the row decoder 2 as well as the latch circuits 6L0a to 6L0c, 6L1a to 6L1c, 6R0a to 6R0c, and 6L1a to 6L1c so as to read out only high order data.

In addition, when the input address signal designates low order data in the 2-bit information, the address recognition circuit 1 outputs a signal controlling the row decoder 2 as well as the latch circuits 6L0a to 6L0c, 6L1a to 6L1c, 6R0a to 6R0c, and 6L1a to 6L1c so as to read out only low order data.

The row decoder 2 selects one each from word lines WL and from word lines WR in accordance with the address signal inputted from outside. At that time, the row decoder 2 sets a word line voltage to be applied to the selected word lines WL and WP in accordance with the control signal from the address recognition circuit 1.

Figure 2:
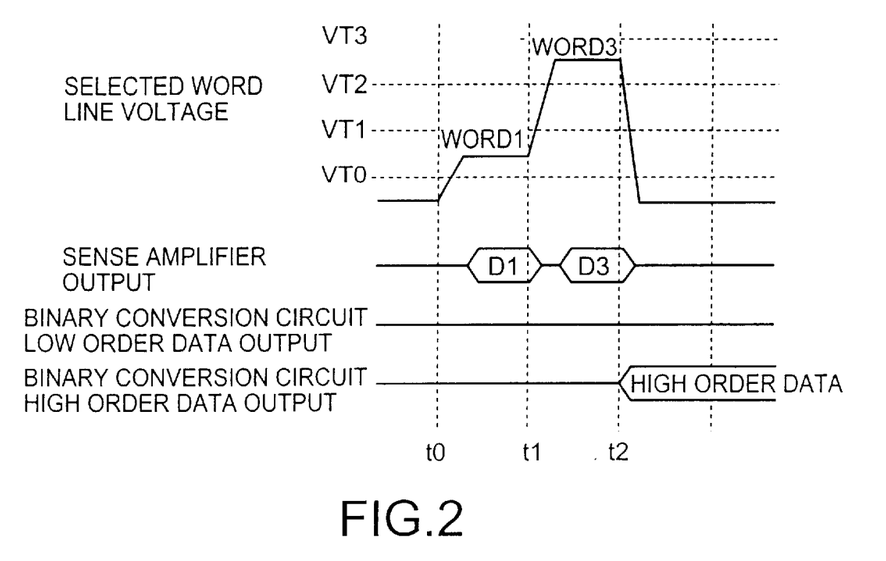
FIG. 2 is a timing chart showing how word-line voltages are applied to selected word-lines when high order data are read out.
Figure 3:
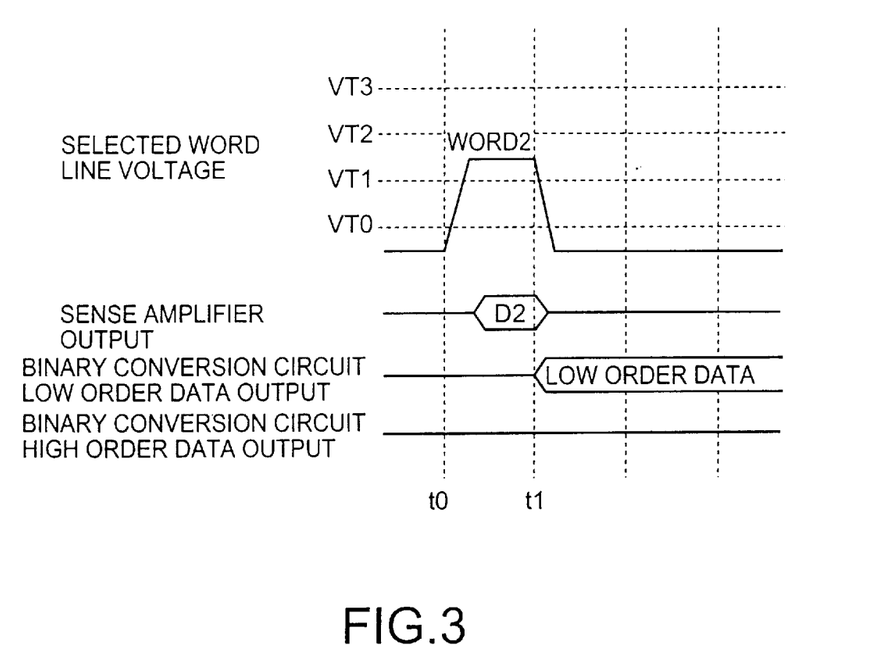
FIG. 3 is a timing chart showing how word-line voltages are applied to selected word-lines when low order data are read out.

FIG. 2 and FIG. 3 are timing charts showing how the word line voltage is applied to the selected word lines WL and WR. FIG. 2 shows a case where high order data are designated by input address signals and FIG. 3 shows a case where low order data are designated by input address signals.

In FIG. 2 and FIG. 3, the mid-potential of the threshold values VT0 and VT1 is designated as the word 1, the mid-potential of the threshold values VT1 and VT2 is designated as the word 2, and the mid-potential of the threshold values VT2 and VT3 is designated as the word 3. That is, VT0<word 1<VT1<word 2<VT2<word 3<VT3 will be fulfilled.

As described above, when the input address signal designates the high order data, the address recognition circuit 1 outputs the control signal instructing only the high order data to be read out.

In accordance with this control signal, the row decoder 2 applies the word 1 voltage to the selected word lines WL and WR at t0 to t1 timing in FIG. 2, and subsequently applies the word 3 voltage to the selected word lines WL and WR at t1 to t2 timing in FIG. 2.

In addition, when the input address signal designates the low order data, the address recognition circuit 1 outputs the control signal instructing only the low order data to be read out.

In accordance with this control signal, the row decoder 2 applies the word 2 voltage to the selected word lines WL and WR at a timing t0 to t1 in FIG. 3.

Incidentally, as concerns the row decoder 2, the voltage for non-selected word lines WL and WR is set at the earth potential (VT0 or lower).

The memory cell transistors ML0, ML1, MR0, and MR1 corresponding with the selected word lines WL and WR will be brought into conductive state when the voltage of the selected word lines WL and WR exceed their own threshold values.

In contrast, the memory cell transistors ML0, ML1, MR0, and MR1 corresponding with the non-selected word lines WL and WR will be brought into the non-conductive state since the voltage of the non-selected word lines WL and WR is the earth potential.

In addition, bit lines BL0, BL1, BR0, and BR1 are respectively earthed when corresponding memory cell transistors ML0, ML1, MR0, and MR1 are brought into a conductive state.

The column decoder 3 decodes the address signal inputted from outside to control the column selectors 4L0, 4L1, 4R0, and 4R1 so as to select bit lines among a plurality of bit lines BL0, BL1, BR0, and BR1 respectively corresponding with addresses designated by input address signals.

When the input address signals designate even addresses, this will cause the column selectors 4L0 and 4R0 to select one each from bit lines BL0 and from bit lines BR0 so that the selected bit line BL0 is brought into connection with the input of the sense amplifier 5L0 and the selected bit line BR0 is brought into connection with the input of the sense amplifier 5R0.

In addition, when the input address signals designate odd addresses, this will cause the column selectors 4L1 and 4R1 to select one each from bit lines BL1 and from bit lines BR1 so that the selected bit line BL1 is brought into connection with the input of the sense amplifier 5L1 and the selected bit line BR1 is brought into connection with the input of the sense amplifier 5R1.

Thus, selection on the word lines and the bit lines will cause one each memory cell transistor in cell plates L and R to be selected.

Next the sense amplifiers 5L0, 5L1, 5R0, and 5R1 detect/amplify the memory information in memory cell transistors ML0, ML1, MR0, and MR1 appearing in the selected bit lines BL0, BL1, BR0, and BR1.

Here, when the input address signals designate high order data, the word line voltage inputted onto the selected word lines WL and WR varies as shown in FIG. 2 so that data D1 corresponding to the potential of the word 1 appear and data D3 corresponding to the potential of the word 3 appear as the output of the sense amplifiers 5L0, 5L1, 5R0, and 5R1.

In this case, the latch circuits 6L0a to 6L0c, 6L1a to 6L1c, 6R0a to 6R0c, and 6L1a to 6L1c operate so as to read out only high order data in accordance with control signals from the address recognition circuit 1. That is, the latch circuits 6L0a, 6L1a, 6R0a, and 6L1a latch the output (data D1) of the sense amplifiers 5L0, 5L1, 5R0, and 5R1 at the t1 timing in FIG. 2, and subsequently the latch circuits 6L0c, 6L1c, 6R0c, and 6L1c latch the output (data D3) of the sense amplifiers 5L0, 5L1, 5R0, and 5R1 at the t2 timing in FIG. 2.

Here, when the input address signals designate low order data, the word line voltage inputted onto the selected word lines WL and WR varies as shown in FIG. 3 so that data D2 corresponding with the potential of the word 2 appear as the output of the sense amplifiers 5L0, 5L1, 5R0, and 5R1.

In this case, the latch circuits 6L0a to 6L0c, 6L1a to 6L1c, 6R0a to 6R0c, and 6L1a to 6L1c operate so as to read out only low order data in accordance with control signals from the address recognition circuit 1. That is, the latch circuits 6L0b, 6L1b, 6R0b, and 6L1b latch the output (data D2) of the sense amplifiers 5L0, 5L1, 5R0, and 5R1 at t1 timing in FIG. 3.

Figure 4:
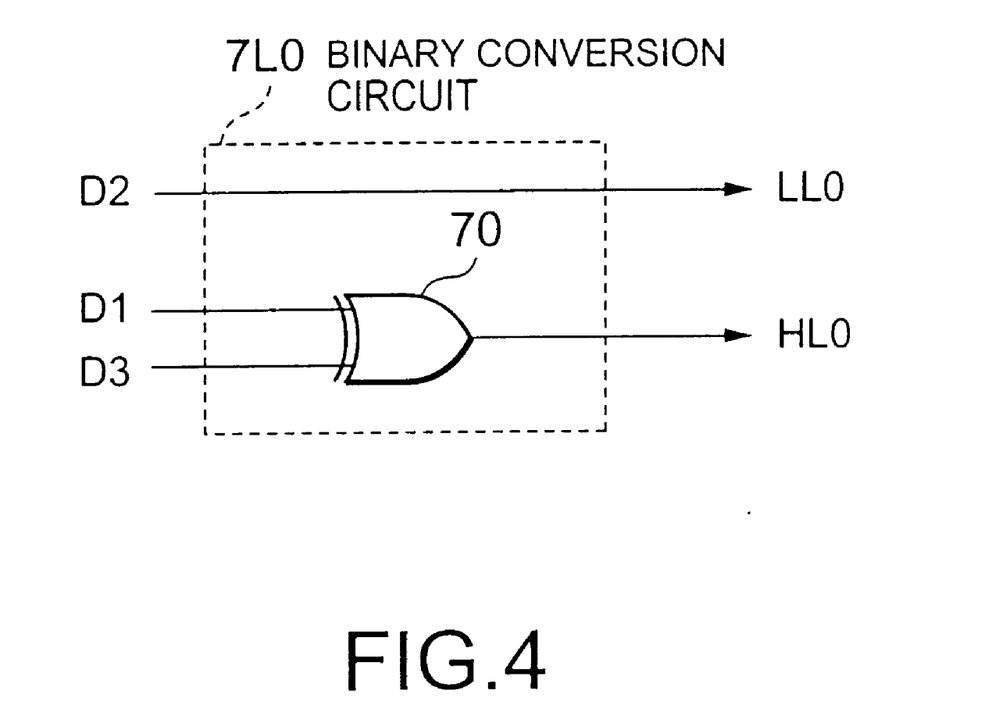
FIG. 4 is a circuit diagram showing a configuration of a binary conversion circuit.

FIG. 4 is a circuit diagram showing a configuration of a binary conversion circuit 7L0. An EOR circuit 70 inside the binary conversion circuit 7L0 implements exclusive OR operation on data D1 held by the latch circuit 6L0a and data D3 held by the latch circuit 6L0c to output the operation result thereof as high order data HL0.

In addition, the binary conversion circuit 7L0 outputs data D2 held by the latch circuit 6L0b as low order data LL0 without any changes.

Thus, the binary conversion circuit 7L0 outputs high order data HL0 and low order data LL0 simultaneously.

Relationship among data D1, D2, D3, high order data HL0, and low order data LL0 is shown in a table. Incidentally, in the table, the reference numeral "0" denotes the state where the selected memory cell transistor ML0 is brought into a conductive state (ON) so that a corresponding bit line BL0 is earthed while the reference numeral "1" denotes the state where the selected memory cell transistor ML0 is brought into a non-conductive state (OFF) so that a corresponding bit line BL0 is not earthed.

| Data D1 | Data D2 | Data D3 | High order data | Low order data |
|---------|---------|---------|-----------------|----------------|
| 1 | 1 | 1 | 0 | 1 |
| 1 | 1 | 0 | 1 | 1 |
| 1 | 0 | 0 | 1 | 0 |
| 0 | 0 | 0 | 0 | 0 |

Likewise, the binary conversion circuit 7L1 implements exclusive OR operation on data D1 held by the latch circuit 6L1a and data D3 held by the latch circuit 6L1c to output the operation result thereof as high order data HL1 together with the data D2 held by the latch circuit 6L1*b* as low order data LL1 without any changes.

The binary conversion circuit 7R0 implements exclusive OR operation on data D1 held by the latch circuit 6R0*a* and data D3 held by the latch circuit 6R0*c* to output the operation result thereof as high order data HR0 together with the data D2 held by the latch circuit 6R0*b* as low order data LR0 without any changes.

In addition, the binary conversion circuit 7R1 implements exclusive OR operation on data D1 held by the latch circuit 6R1*a* and data D3 held by the latch circuit 6R1*c* to output the operation result thereof as high order data HR1 together with the data D2 held by the latch circuit 6R1*b* as low order data LR1 without any changes.

An output data switching circuit 8L selects any one of data HL0, LL0, HL1, and LL1 in accordance with address signals inputted from outside and outputs this as output data OUTL. For example, when the input address signal is an even address and designates high order data, the output data switching circuit 8L will select data HL0 for outputting.

Likewise, an output data switching circuit 8R selects any one of data HR0, LR0, HR1, and LR1 in accordance with address signals inputted from outside and outputs this as output data OUTR.

As described above, the 2-bit output data OUTL and OUTR can be read out.

In the present invention, when high order data are designated with the input address signals, potentials for the selected word lines WL and WR are set at two stages being the potential of the word 1 and the word 3 which are least necessary for the designated high order data to be read out.

Accordingly, in the present invention, since the potential of the word 2 is not applied, high order data can be completely read out for two thirds of the time period required for the semiconductor memory device shown in FIG. 6.

In the present invention, when low order data are designated with the input address signals, potentials for the selected word lines WL and WR are set at the potential of the word 2 which is least necessary for the designated low order data to be read out.

Accordingly, in the present invention, since the potentials of the words 1 and 3 are not applied, low order data can be completely readout for one third of the time period required for the semiconductor memory device shown in FIG. 6.

Figure 5:
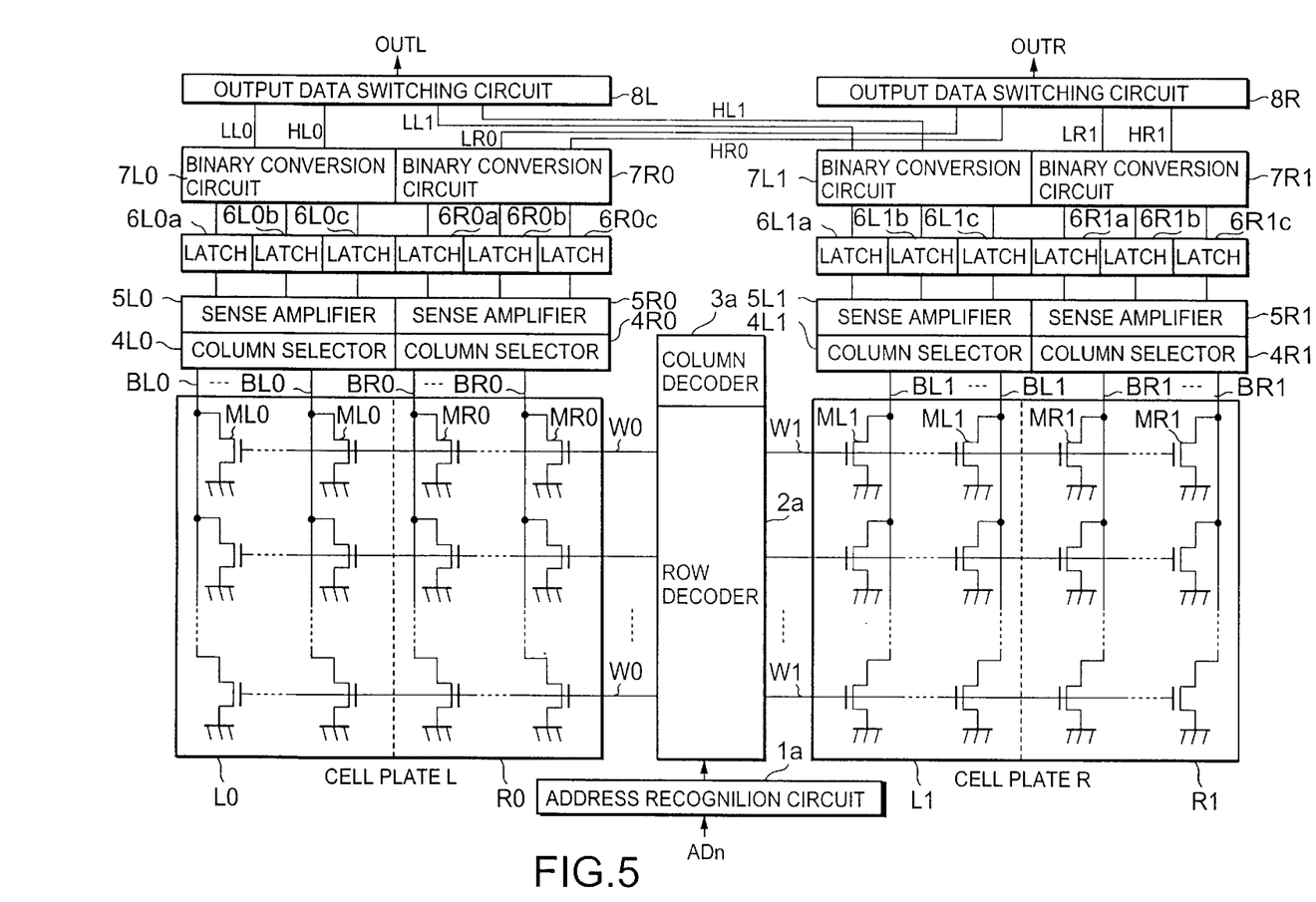
FIG. 5 is a block diagram showing a configuration of a non-volatile semiconductor memory device to become a second embodiment of the present invention.

FIG. 5 is a block diagram showing a configuration of a non-volatile semiconductor memory device to become a second embodiment of the present invention in which the same code as in FIG. 1 denotes the same configuration.

In Embodiment 1, memory cell transistor corresponding with even addresses and memory cell transistor corresponding with odd addresses are disposed in a single cell plate so that word lines are provided for each memory cell transistor in the row direction regardless of even addresses or odd addresses.

In contrast, in the present embodiment, either a memory cell transistor corresponding with even addresses or a memory cell transistor corresponding with odd addresses are disposed in a single cell plate so that word lines corresponding with even addresses and word lines corresponding with odd address are separated.

That is, the memory array of the present embodiment, which is classified into a cell plate L and a cell plate R as in Embodiment 1, comprises a cell plate L to be classified into cell plates L0 and R0 corresponding with even addresses and a cell plate R to be classified into cell plates L1 and R1 corresponding with odd addresses.

Word lines W0, which are provided for each memory cell transistor ML0 and MR0 on each row inside the cell plate L, are brought into common connection with gates of a memory cell transistors ML0 and MR0 for a corresponding row.

Word lines W1, which are provided for each memory cell transistor ML1 and MR1 on each row inside the cell plate R, are brought into common connection with gates of a memory cell transistors ML1 and MR1 for a corresponding row.

The row decoder 2 in Embodiment 1 applies the same word line voltage onto word lines WL and WR on the same row inside the cell plates L and R.

In contrast, the row decoder 2*a* of the present embodiment can independently apply different word line voltages respectively onto the word lines W0 and W1.

In order to realize such application of word line voltages, the address recognition circuit 1*a* of the present embodiment judges not only whether the input address signal designates high order data or designates low order data, but also designates whether the input address signal designates an even address or designates an odd address.

Next, operation of the semiconductor memory device as described above will be described. The semiconductor memory device of the present embodiment selects two memory cell transistors from any one of the cell plate L or the cell plate R at one access so as to obtain 2-bit output data OUTL and OUTR.

When the address signal inputted from outside is an even address and designates high order data, the address recognition circuit 1*a* outputs signals to control the row decoder 2*a* as well as the latch circuits 6L0*a* to 6L0*c*, 6L1*a* to 6L1*c*, 6R0*a* to 6R0*c*, and 6L1*a* to 6L1*c* so as to read out high order data from the cell plate L corresponding with the even address. In addition, when the input address signal is an even address and designates low order data, the address recognition circuit 1*a* outputs control signals to give an instruction to read out only low order data from the cell plate L corresponding with the even address.

Likewise, when the input address signal is an odd address and designates high order data, the address recognition circuit 1*a* outputs signals to control the row decoder 2*a* as well as the latch circuits 6L0*a* to 6L0*c*, 6L1*a* to 6L1*c*, 6R0*a* to 6R0*c*, 6L1*a* to 6L1*c* so as to read out only high order data from the cell plate R corresponding with the odd address. In addition, when the input address signal is an odd address and designates low order data, the address recognition circuit 1*a* outputs control signals to give an instruction to read out only low order data from the cell plate R corresponding with the odd address.

A row decoder 2*a* selects one from a plurality of word lines W0 or from a plurality of word lines W1 in accordance with the input address signal. At this time, the row decoder 2*a* sets word line voltages to be applied to the selected word lines W0 and W1 in accordance with the control signal from the address recognition circuit 1*a*.

When the address recognition circuit 1*a* outputs a control signal instructing only the high order data to be read out from the cell plate L, the row decoder 2*a* applies the voltage of the word 1 onto the selected word line W0 at the t0 to t1 timing in FIG. 2, and subsequently applies the voltage of the word 3 onto the selected word line W0 at the t1 to t2 timing in FIG. 2.

When the address recognition circuit 1a outputs a control signal instructing only the low order data to be read out from the cell plate L, the row decoder 2a applies the voltage of the word 2 onto the selected word line W0 at the t0 to t1 timing in FIG. 3.

When the address recognition circuit 1a outputs a control signal instructing only the high order data to be read out from the cell plate R, the row decoder 2a applies the voltage of the word 1 onto the selected word line W1 at the t0 to t1 timing in FIG. 2, and subsequently applies the voltage of the word 3 onto the selected word line W1 at the t1 to t2 timing in FIG. 2.

In addition, when the address recognition circuit 1a outputs a control signal instructing only the low order data to be read out from the cell plate R, the row decoder 2a applies the voltage of the word 2 onto the selected word line W1 at the t0 to t1 timing in FIG. 3.

Incidentally, the row decoder 2a sets the voltages of the non-selected word lines W0 and W1 at the earth potential (of not more than VT0).

Similar to Embodiment 1, the column decoder 3a controls the column selectors 4L0, 4L1, 4R0, and 4R1 based on the input address signals.

Thus, when the input address signal designates an even address, the column selectors 4L0 and 4R0 respectively select one each from a plurality of bit lines BL0 and BR0, and when the input address signal designates an odd address, the column selectors 4L1 and 4R1 respectively select one each from a plurality of bit lines BL1 and BR1.

Operation of the sense amplifiers 5L0, 5L1, 5R0, and 5R1 is the same as those in Embodiment 1.

Next, when the address recognition circuit 1a outputs a control signal instructing only high order data to be read out from the cell plate L, the latch circuits 6L0a and 6R0a latches outputs (data D1) of the sense amplifiers 5L0 and 5R0 at the timing t1 in FIG. 2 and subsequently the latch circuits 6L0a and 6R0c latches outputs (data D3) of the sense amplifiers 5L0 and 5R0 at the timing t2 in FIG. 2.

When the address recognition circuit 1a outputs a control signal instructing only low order data to be read out from the cell plate L, the latch circuits 6L0b and 6R0b latches outputs (data D2) of the sense amplifiers 5L0 and 5R0 at the timing t1 in FIG. 3.

In addition, when the address recognition circuit 1a outputs a control signal instructing only high order data to be read out from the cell plate R, the latch circuits 6L1a and 6R1a latches outputs (data D1) of the sense amplifiers 5L1 and 5R1 at the timing t1 in FIG. 2 and subsequently the latch circuits 6L1c and 6R1c latches outputs (data D3) of the sense amplifiers 5L1 and 5R1 at the timing t2 in FIG. 2.

In addition, when the address recognition circuit 1a outputs a control signal instructing only low order data to be read out from the cell plate R, the latch circuits 6L1b and 6R1b latches outputs (data D2) of the sense amplifiers 5L1 and 5R1 at the timing t1 in FIG. 3.

Operation of binary conversion circuits 7L0, 7L1, 7R0, and 7R1 as well as output data switching circuits 8L and 8R is the same as that in Embodiment 1.

Thus, the same effects as in Embodiment 1 can be obtained. Moreover, the semiconductor memory device of the present practical embodiment is featured by its capability to reduce consumption current compared with that in Embodiment 1.

That is, in Embodiment 1, since the word line is provided for each memory cell transistor in the direction of rows regardless of the even address or the odd address, in spite that only any one of the even address or the odd address is an object for access, the word line voltage is applied to both the memory cell transistor corresponding with the even address and the memory cell transistor corresponding with the odd address.

In contrast, in the present embodiment, the word line W0 corresponding with the even address and the word line W1 corresponding with the odd address are separated so that the row decoder 2a can apply different word line voltages to the word lines W0 and W1.

Thus, since only any one of the word lines W0 and W1 respectively corresponding with an even address or an odd address being an object for access is brought into a selected state while other word lines being not an object for access are brought into the non-selected state, current reduction (by approximately a half of the device in FIG. 1) can be attempted.

Next, the semiconductor memory device of the present embodiment is featured that an even address as well as one step forward odd address at one access or an odd address as well as one step forward even address can be selected and time for reading out can be shortened when serial continuous access implementing reading out from address in series. Operation in the case where such serial continuous access is implemented will be described as follows.

When serial continuous access takes place, the address recognition circuit 1a detects a one step forward input address signal of a present input address signal simultaneously, and in the case where the present input address signal is an even address and the one step forward input address signal designates high order data, such a control signal is outputted that instructs the control signal based on the present input address signal to be outputted as well as the control signal instructing only high order data to be read out from the cell plate R corresponding with the odd address to be read out.

In addition, in the case where the present input address signal is an even address and the one step forward input address signal designates low order data, the address recognition circuit 1a outputs the control signal based on the present input address signal as well as the control signal instructing only low order data to be read out from the cell plate R corresponding with the odd address.

Incidentally, the reason why reading out takes place from the cell plate R is that in the case of serial continuous access, when the present input address signal designates an even address, an input address signal in one step forward will designate an odd address.

Similarly, in the case where the present input address signal is an odd address and the one step forward input address signal designates high order data, the address recognition circuit 1a outputs the control signal based on the present input address signal as well as the control signal instructing only high order data to be read out from the cell plate L corresponding with the even address.

In addition, in the case where the present input address signal is an odd address and the one step forward input address signal designates low order data, the address recognition circuit 1a outputs the control signal based on the present input address signal as well as the control signal instructing only low order data to be read out from the cell plate L corresponding with the even address.

When serial continuous access is implemented, the row decoder 2a selects a word line from any one of word lines W0 or word lines W1 in accordance with the present input address signal and at the same time selects a word line from the other one of word lines W0 or word lines W1 in accordance with the input address signal in one step forward.

In addition, the row decoder 2a applies an independent word line voltage to the selected word line W0 and the selected word line W1 in accordance with the control signal from the address recognition circuit 1a.

For example, in the case where a word line W0 is selected in accordance with the present input address signal and at the same time a word line W1 in accordance with the input address signal in one step forward is selected and the present input address signal designates a high order data and the input address signal in one step further designates a low order data, the row decoder 2a applies word 1 voltage to the selected word line W0 as well as applies word 2 voltage to the selected word line W1, and subsequently applies the word 3 voltage to the selected word line W0.

Next, in the case where serial continuous access is implemented, the column decoder 3a decodes the present input address signal and controls the column selectors 4L0, 4L1, 4R0, and 4R1 so that bit lines corresponding with the address designated by this address signal are selected and at the same time decodes an input address signal in one step forward and controls the column selectors 4L0, 4L1, 4R0, and 4R1 so that bit lines corresponding with the address designated by this address signal.

Thus the column selectors 4L0 and 4R0 select one each from bit lines BL0 and bit lines BR0 respectively while the column selectors 4L1 and 4R1 select one each from bit lines BL1 and bit lines BR1 respectively.

As described above, the latch circuits 6L0a to 6L0c, 6L1a to 6L1c, 6P0a to 6R0c, and 6L1a to 6L1c operate in accordance with control signals from the address recognition circuit 1a.

Accordingly, in the case where a word line W0 is selected in accordance with the present input address signal and at the same time a word line W1 in accordance with the input address signal in one step forward is selected and the present input address signal designates a high order data and the input address signal in one step further designates a low order data, the latch circuits 6L0a and 6R0a latch the outputs of the sense amplifiers 5L0 and 5R0 and at the same time the latch circuits 6L1b and 6R1b latches the outputs of the sense amplifiers 5L1 and 5R1 and subsequently the latch circuits 6L0c and 6R0c latch the outputs of the sense amplifiers 5L0 and 5R0.

The output data switching circuit 8L selects any one of the data HL0, LL0, HL1 and LL1 in accordance with the present input address signal while the output data switching circuit 8R selects any one of the data HR0, LR0, HR1 and LR1 in accordance with the present input address signal.

Thus, after the output data OUTL and OUTR in accordance with the present input address signals are outputted, the output data switching circuits 8L and 8R output the output data OUTL and OUTR in accordance with the input address signals in one step forward. That is, the output data switching circuit 8L selects any one of the data HL0, LL0, HL1, and LL1 in accordance with the input address signal in one step forward while the output data switching circuit 8R selects anyone of the data HR0, LR0, HR1, and LR1 in accordance with the input address signal in one step forward.

As described above, the serial continuous access can be implemented. Thus, in the present embodiment, when serial continuous access is implemented, prefetch operation in which an even address together with an odd address in one step forward thereof or an odd address together with an even address in one step forward thereof is selected with one access is realized.

Accordingly, an address in one step forward from the present address will not need to be read out newly so that time period to read out can be shortened.

According to the present invention, recognition means to judge whether the input address signal designates upper data or designates lower data so that in accordance with results of the address recognition means the row selecting means apply only a smallest word line voltage necessary for reading out upper data or lower data among word line voltage levels to the selected word lines, and therefore unnecessary word line voltage will not be applied as in conventional cases. Consequently, read-out time can be shortened.

In addition, the first word line corresponding with an even address and the second word line corresponding with an odd address are separated so that the row selection means can apply different word line voltages to the first and second word lines, and thus only any one of the first and second word lines respectively corresponding with an even address or an odd address being an object for access is brought into a selected state while other word lines being not an object for access are brought into the non-selected state so that consumption current can be reduced.

In addition, when the recognition means implement judgment based on the present input address signal and also implement judgment based on the input address signal in one step forward from the present one, the row selection means implement word line selection in accordance with the present input address and at the same time implement word line selection in accordance with the input address signal in one step forward, the column selection means select bit lines in accordance with the present input address signal and at the same time select bit lines in accordance with input address signals in one step forward so that prefetch operation in which an even address together with an odd address in one step forward thereof or an odd address together with an even address in one step forward thereof is selected with one access can be realized and thus read-out time in the case where serial continuous access is implemented can be shortened.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor memory device, which has a multi-valued memory cell to memorize a plurality of bits and in which a plurality of word line voltage levels are stipulated in advance to read out said plurality of bits, comprising:

a memory cell array in which said memory cells are disposed in a matrix;

word lines provided in memory cells on each line;

bit lines provided in memory cells on each column;

recognition means to judge whether an input address signal designates upper data or designates lower data among said bits;

row selection means to select word lines in accordance with input address signals and apply only word line voltage necessary for reading out upper data or lower data among said word line voltage levels in accordance with the results of recognition means;

column selection means to select bit lines in accordance with input address signals; and output means generating output data in accordance with selected bit line levels.

2. The semiconductor memory device according to claim 1, wherein:

said multi-valued memory cell is configured to memorize 2 bits;

two kinds of said word line voltage only are applied to selected word lines when said input address designates upper data; and one kind of said word line voltage only is applied to selected word lines when said input address designates lower data.

3. A semiconductor memory device, which has a multi-valued memory cell to memorize a plurality of bits and in which a plurality of word line voltage levels are stipulated in advance to read out said plurality of bits, comprising:

a memory cell array in which said memory cells are disposed in a matrix;

first word lines provided in memory cells on each line corresponding with even addresses;

second word lines provided in memory cells on each line corresponding with odd addresses;

bit lines provided in memory cells on each column;

recognition means to judge whether a present input address signal designates even address or designates odd address and to judge whether an input address signal designates upper data or designates lower data among said bits;

row selection means to select word lines from any one of the first word line or the second word line in accordance with present input address signals and apply only a smallest word line voltage necessary for reading out upper data or lower data among said word line voltage levels to selected word lines in accordance with results of recognition means;

column selection means to select bit lines in accordance with present input address signals; and output means generating output data in accordance with selected bit line levels.

4. The semiconductor memory device according to claim 3, wherein:

said multi-valued memory cell is configured to memorize 2 bits;

two kinds of said word line voltage only are applied to selected word lines when said input address designates upper data; and one kind of said word line voltage only is applied to selected word lines when said input address designates lower data.

5. The semiconductor memory device according to claim 4, wherein:

said recognition means judge whether an input address signal in one step forward from present input address signal designates upper data or designates lower data when serial continuous access is implemented;

said selection means select word lines in accordance with present input address signals when serial continuous access is implemented and select word lines in accordance with input address signals in one step forward so that for selected word lines based on present input address signals, only a word line voltage necessary is applied for reading out upper data or lower data for selected word lines based on present input address signals in accordance with results of recognition means based on present input address signals, and simultaneously only a word line voltage necessary is applied for reading out upper data or lower data for selected word lines based on input address signals in one step forward in accordance with results of recognition means based on input address signals in one step forward; and said column selection means select bit lines in accordance with present input address signals and simultaneously select bit lines in accordance with input address signals in one step forward.

* * * * *